United States Patent [19]
Lee et al.

[11] Patent Number: 5,748,527
[45] Date of Patent: May 5, 1998

[54] NONVOLATILE MEMORY HAVING TRANSISTOR REDUNDANCY

[75] Inventors: Roger R. Lee; Fernando Gonzalez, both of Boise, Id.

[73] Assignee: Micron Technology, Inc., Boise, Id.

[21] Appl. No.: 710,917

[22] Filed: Sep. 24, 1996

Related U.S. Application Data

[63] Continuation of Ser. No. 393,578, Feb. 23, 1995, Pat. No. 5,559,742.

[51] Int. Cl.$^6$ ............................................. G11C 7/00
[52] U.S. Cl. ............... 365/185.09; 365/200; 365/185.33
[58] Field of Search ...................... 365/200, 185.29, 365/185.3, 185.33, 185.09

[56] References Cited

U.S. PATENT DOCUMENTS

| | | | |
|---|---|---|---|
| 5,058,071 | 10/1991 | Kohda et al. | 365/185.09 |
| 5,157,628 | 10/1992 | Tani | 365/200 |
| 5,220,518 | 6/1993 | Haq | 365/200 |
| 5,233,559 | 8/1993 | Brennan, Jr. | 365/210 |
| 5,329,488 | 7/1994 | Hashimoto | 365/185.09 |
| 5,388,076 | 2/1995 | Ihara | 365/200 |

*Primary Examiner*—Vu A. Le

[57] ABSTRACT

A flash memory array comprises a primary row line and a redundant row line each having memory cells therealong. A method of accessing the flash memory array comprises preprogramming all said memory cells. Next, all memory cells are erased simultaneously. Subsequently, all memory cells along the primary row line are programmed and the cells along the redundant row line are selectively programmed. The primary row line is bypassed during any read cycle.

22 Claims, 3 Drawing Sheets

NONVOLATILE MEMORY HAVING TRANSISTOR REDUNDANCY

This is a continuation of U.S. application Ser. No. 08/393,578 filed Feb. 23, 1995 and issued Sep. 24, 1996 as U.S. Pat. No. 5,559,742.

FIELD OF THE INVENTION

The invention relates generally to the field of nonvolatile semiconductor memories, and more specifically to the field of programmable memories.

BACKGROUND OF THE INVENTION

An increasingly common nonvolatile semiconductor memory is referred to as a "flash" memory. A flash memory includes an array of electrically programmable and electrically erasable memory cells. Typically, each memory cell comprises a single n-channel metal oxide semiconductor (NMOS) transistor, including a floating gate between a control (input) gate and a channel. Information is stored in the memory cells by storing a charge on the floating gate which adjusts a Vt (threshold voltage) of the transistor. The threshold voltage is the voltage that must be overcome by the gate to source voltage (Vgs) to activate the device.

For example, Vt for a typical transistor with no charge stored on its floating gate is approximately six volts. This means that a voltage of at least six volts must be applied between the control gate and the source junction for the device to activate, that is, to allow current to flow through the device. If a charge is present on the floating gate Vt is effectively raised by the charge present. The net effect of this is that an intermediate voltage (a sense voltage) can be applied between the source and the control gate and if the transistor activates it is not programmed and if the transistor does not activate it is programmed.

The memory cells in the array are accessed via a plurality of column lines (digit lines) and a plurality of row lines (word lines). Each of the column lines is coupled to the drain of a corresponding memory cell transistor, and each of the row lines is coupled to a control gate of a corresponding memory cell transistor. The respective column and row lines are driven by address decoder and timing circuitry.

In the manufacture of flash memory arrays, it is not uncommon for one or more memory cells in a row of the array to become defective. Such defects are commonly caused by a short between a column line and a row line associated with a particular memory cell. In other words, the drain and control gate of the transistors within a particular defective row are shorted together. Other types of defects can also occur, such as single bit or multiple bit failures.

In memory devices other than flash memory arrays, specifically dynamic random-access memories (DRAMs), one solution to this problem is to replace a particular defective row and/or column by addressing a redundant row and/or column. This is not a solution for flash memory arrays, however. Unlike DRAM arrays, all sources in a particular sector of flash cells are tied together to allow for erasing of all transistors simultaneously. It becomes apparent that tying together all the sources in a sector within a flash memory array precludes using the redundancy approach when considering the operation of a flash memory device. In a typical flash device, a programmed transistor has a Vt of six volts and an unprogrammed transistor Vt is zero volts. An unprogrammed cell (one which conducts at the sense voltage) can be arbitrarily assigned a logic 1 value, while a programmed cell (one which does not conduct at the sense voltage) can be assigned a logic 0 value. To reprogram a flash memory device, all the transistors are preprogrammed to six volts and then erased to zero volts. Next, a charge is stored on the floating gate of only on those transistors to be programmed. If the transistors are not first preprogrammed but only erased, those already having no charge on the floating gate fall into depletion mode since they would be erased to a negative Vt.

However, if a redundant row is used within a flash device the replaced row is not preprogrammed because the preprogramming is directed to the redundant row. The replaced row would be erased however because the sources of the transistors within the defective row are common to the sources of all the transistors within a particular sector, and all transistors in the sector, including the replaced row, will be erased. With each reprogramming of the flash memory, the replaced row falls deeper and deeper into depletion mode since it is bypassed during programming. Any depletion mode transistors within a sector affects the performance of other transistors within that sector as is known in the art. Therefore, the approach commonly employed by DRAMs cannot be used by flash memories.

There is, therefore, a need for an improved flash memory and an associated control circuit to overcome the above-mentioned deficiencies.

SUMMARY OF THE INVENTION

An embodiment of the invention comprises a method of accessing a memory array such as a flash memory array. The memory array comprises at least first and second conductive lines each having memory elements therealong. The method comprises erasing all memory elements along the first and second conductive lines. Subsequent to erasing the elements, all memory elements along the first conductive line are programmed. Next, the elements along the second conductive line are selectively programmed. The first conductive line is bypassed during any read cycle.

The above summary of the present invention is not intended to present each embodiment or every aspect of the present invention. That is the purpose of the figures and the associated description which follow.

BRIEF DESCRIPTION OF THE DRAWINGS

Aspects and advantages of the present invention will become apparent upon reading the following detailed description and upon reference to the drawings in which.

DETAILED DESCRIPTION OF THE INVENTION

The present invention is directed to improving the yield of flash memory devices by allowing row and/or column redundancy and is illustrated and discussed in this context. The present invention is not limited to flash memories, however. It has a wide variety of other applications, for example in semiconductor memories and circuits that are susceptive to falling into depletion mode. Further, the invention is described with reference to shorted row and column lines although the invention provides solutions to numerous other defects such as single bit failures and other failures.

Figure 1:
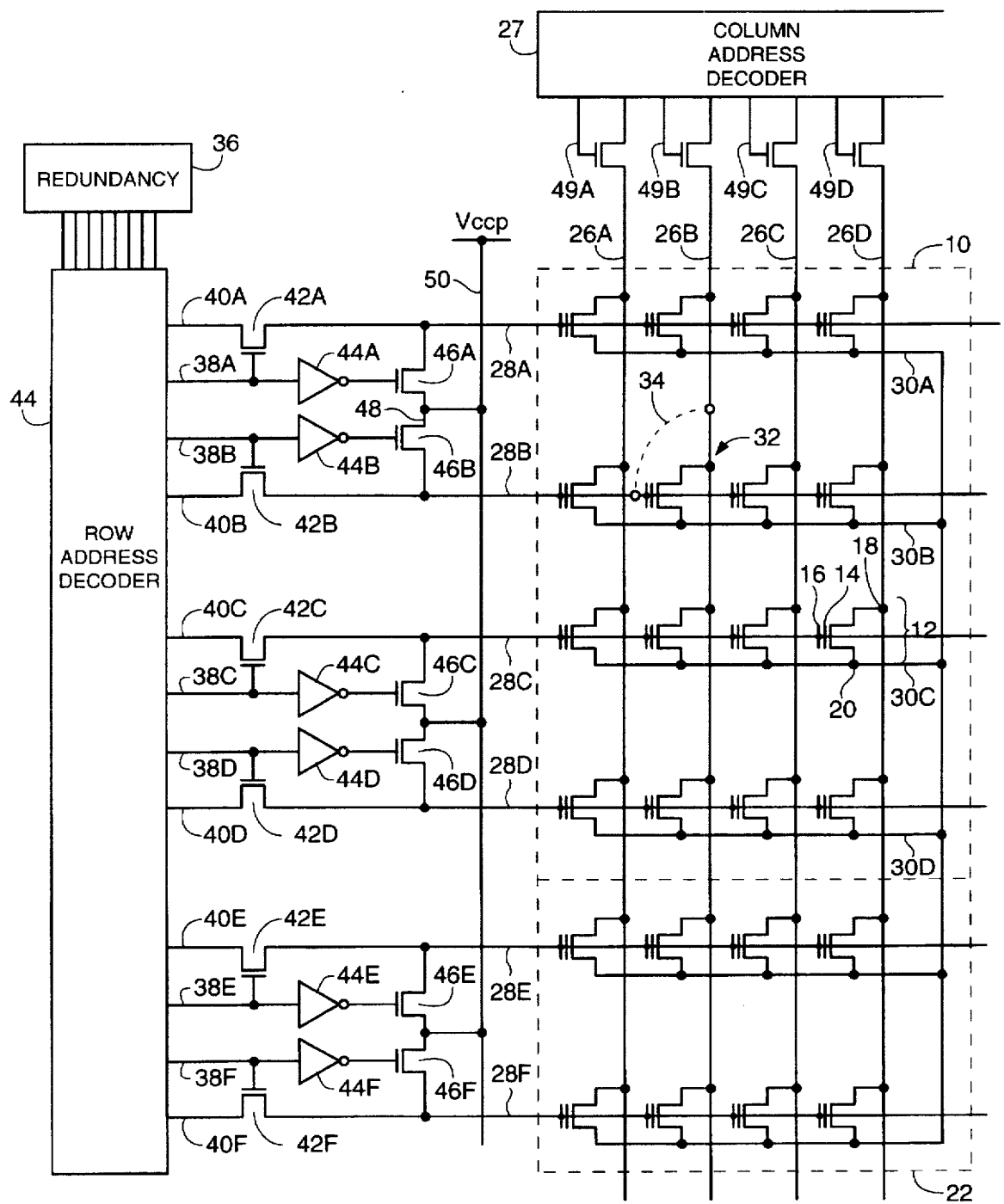
FIG. 1 is a circuit diagram of a first embodiment of the invention.

A flash memory device having a short between a row line and a column line is shown in FIG. 1. The flash memory in FIG. 1 has a memory array 10 including a plurality of memory elements such as cells or transistors 12. Each memory cell comprises a transistor having a floating gate 14, a control gate 16, a drain 18, and a source 20. The transistor in each memory cell is an NMOS transistor, but it is appreciated that the transistor can be any type such as a p-channel metal oxide semiconductor (PMOS) transistor. The flash memory in FIG. 1 also has a redundant memory array 22 including a pair of redundant rows 28E, 28F of memory cells.

The flash memory device also comprises a plurality of column lines (digit lines) 26 controlled by a column decoder 27. Each of column lines 26 couples the drains 18 of a plurality of memory cells along one column. In is addition to the redundant rows the flash device comprises a plurality of primary row lines (word lines) 28 which couple the control gates 16 of a plurality of memory cells 12 along one of the rows. The sources 20 of the memory cells in one sector are connected according to conventional flash memory designs. In the FIG. 1 embodiment, the cells shown are from a single sector but the entire sector is not shown. The sources 20 are commonly connected to a power source (not shown) that typically provides zero or twelve volts. It is appreciated that other voltages can be applied to the sources.

In FIG. 1 transistor 12 includes floating gate 14, a control gate 16 coupled to row line 28C, drain 18 coupled to column line 26D, and source 20 coupled to source line 30C and is representative of a memory cell that is functioning correctly (is not shorted). Also shown is a transistor 32 having its control gate 16 shorted to its drain 18 through short 34. Such a short typically results from a manufacturing defect.

In FIG. 1, the same column lines 26A-26D are connected with transistors in array 10 as array 22 in a similar manner as described above. The replacement of the shorted row 28B by one of the redundant rows 28E, 28F is accomplished in a manner similar to a DRAM device such as by blowing a laser or electrical fuse, or by other workable means, to direct programming and reading from the shorted row 28B to the redundant row 28E, for example.

At least three operations are performed within a flash memory array including a read operation, an erase operation, and a program (write) operation. To perform a read operation on a correctly operating memory cell that is not shorted a sense voltage (a voltage between the low Vt and the high Vt) is applied across the control gate and the source. For example, the row line (and therefore the control gate) is set to five volts and source is set to zero volts. A cell that is not programmed will conduct and output a logic 1 to the column line, which is detected by a sense amplifier. If a defective row is replaced by a redundant row, the replaced row will be bypassed and a correct read of the redundant cell will occur.

Programming a correctly performing memory array (i.e. changing the Vt from zero volts to six volts) is typically accomplished by applying a voltage between source and drain of the transistor, such as zero volts to the source and six volts to the drain, while applying a large voltage such as 12 volts to the control gate of each transistor. These voltages inject "hot electrons" from the substrate to the floating gate. If a defective row is replaced by redundant row, the replaced row will again be bypassed and a correct program of the redundant cell will occur.

The third memory operation, erase, is performed by applying a voltage between the control gate and the source, for example zero volts to the row line and twelve volts to the source, and allowing the column line to float. Since all sources in the sector are tied together all cells in the sector are erased simultaneously. Erasing a cell returns electrons on the floating gate to the substrate. Table 1 provides a summary of the various described voltages as they relate to a functioning memory array, although other voltages are possible and likely.

TABLE 1

| Voltages Relating to a Functioning Memory Cell | | | |
|---|---|---|---|
| | Row Line | Source Line | Column Line |
| Read | 5 Volts | 0 Volts | Sensed |
| Erase | 0 Volts | 12 Volts | Float |
| Program | 12 Volts | 0 Volts | 6 Volts |

In a normally functioning sector of a flash memory device all cells are first preprogrammed to a Vt of six volts before they are erased. If the transistors were not first preprogrammed, those cells already having a Vt of zero volts would be erased to below zero volts and the cell would fall into depletion mode. Cells in depletion mode negatively impact the electrical characteristics of surrounding cells in a manner well known in the art. If a redundant row is used in a conventional device to replace a row having a shorted column and row line, the replaced row would also be erased since the erasure occurs on all cells in the sector. As has been described above the programming bypasses the replaced row so it is not programmed or preprogrammed, but the erase cycle erases the replaced row. The cells on the replaced row, since they are erased but not programmed, fall into depletion mode and adversely affect surrounding cells. A redundant row therefore cannot typically be used with a flash device.

Table 2 summarizes the described voltages as they relate to a nonfunctioning shorted memory cell. It can be seen that the voltages on the row line and column line are the same, resulting from the shorting of the row line and column line.

TABLE 2

| Voltages Relating to a Transistor Accessed by a Shorted Row Line and a Shorted Column Line in a Conventional Flash Device | | | |
|---|---|---|---|
| | Row Line | Source Line | Column Line |
| Read | 5 Volts | 0 Volts | 5 Volts |
| Erase | 0 Volts | 12 Volts | 0 Volts |
| Program | 7 Volts | 0 Volts | 7 Volts |

As shown in Table 2, the voltage on column 26B of a shorted device is limited to seven volts. Since the row line and column line are shorted, the voltage on the row line is also limited to seven volts even if a higher voltage is applied to the row line on Vccp. This is due to the breakdown of digit line N+junctions which are limited by the doping profiles of the drain junction. The doping profile is required to ensure good transistor device punchthrough protection.

FIG. 1 shows a circuit which allows a flash device to use a redundant row to functionally replace a defective primary row. Row and column redundancy such as is used with a DRAM device is well known in the art. The embodiments of the invention herein are described for use with a redundancy scheme which outputs a redundancy signal which is "low" if a row is replaced or is an unused redundant row, or a 'high' if the row is used, although these signals could change according to an equivalent design. The embodiments of the invention are shown for use with row lines, although similar embodiments can be used on defective columns as well.

As shown in FIG. 1, row line 28B is shorted with column line 26B through short 34. Row line 28B, therefore, is to be replaced by redundant row line 28E, such as by blowing a laser fuse, an electrical fuse, or other workable redundancy circuits 36 to redirect programming and read operations from to row line 28B to row line 28E. Redundancy row 28F is not used, and therefore is treated as a shorted row. Row address decoder 44 outputs five volts to row lines 40A–40F during a read cycle, zero volts during an erase cycle, and twelve volts during a program. The redundancy scheme 36 outputs a high to redundancy signals 38A, 38C, 38D, and 38E, and outputs a low to redundancy signals 38B and 38F. The high on 38A, 38C, 38D, and 38E causes pass transistors 42A, 42C, 42D, and 42E to pass signals from the row address decoder 44 to row lines 28A, 28C, 28D, and 28E respectively. The functioning rows 40A, 40C, 40D, and 40E operate as typical rows, with 40E replacing 40B resulting from the redundancy circuitry.

The redundancy scheme 36 outputs a low signal to 38B, thereby deactivating pass transistor 42B. Row 38F is, the unused redundant row, is treated similarly but is not described in detail as any nonfunctioning rows or nonused redundant rows are treated similarly. Row 38F is treated as a nonfunctioning row to prevent the unused transistors therealong from being erased into depletion.

The low on 38B is inverted by 44B which activates transistor 46B. The source 48 of transistor 46B is tied, in the instant case, to Vccp 50 which outputs six volts, but any voltage which allows for programming of transistors along the defective row line would be sufficient. The voltage on the source 48 of transistor 46B, along with the high on the gate of transistor 46B, increases the voltage on row line 28B. Since row line 28B and column line 26B are shorted, the voltage is also transferred to column line 26B. As Vccp is output to row line 28B (and to column line 26B through short 34) when a low is output on 38B, column line 26B would also have to be replaced in this embodiment by a redundant column. This is because the voltage from Vccp would be present on 26B during a read of the transistors along 26B which would give incorrect data. Redundancy of column line 26B can be accomplished using the circuitry described herein, standard DRAM column redundancy, or any workable replacement scheme. A portion of the circuitry relating to column redundancy is generally shown as transistors 49A–49D.

During an erase of the sector, the transistors along 28B (and along unused redundant row 28F) will also be erased. However, during the erase six volts will be applied to the control gates of transistors along row line 28B instead of the zero volts applied to the control gates of the cells along the nonshorted row lines. The transistors along 28B will therefore not be erased to zero volts as quickly as the cells along the functioning row lines. This aids in reducing the depletion of cells along 28B. However, during programming, six volts is applied to the row line of 28B rather than the twelve volts during a normal program and preprogram, and programming would not occur as quickly. Depending on the timing it may be necessary to increase the preprogramming time to ensure that the Vt of devices at the intersection of shorted row line 28B and column lines 26A, 26C and 26D remain above zero volts.

In any case, the six volts from Vccp 50 on row line 28B and column line 26B causes transistor 32 to be programmed whenever the voltage on the sector source is below the voltage on 28B and 26B. The programming of transistor 32 ramps until the Vt of the transistor equals the potential between the control gate and the source (Vgs). The programming of transistor 32 is therefore self limiting as programming stops when Vt equals Vgs for transistor 32. During an erase of the sector, the Vt of transistor 32 decreases to a low Vt. Then after the erase cycle the transistor ramps from its low Vt until its Vt equals Vgs. Again, the transistors at the intersection of row line 28B and column lines 26A, 26C, and 26D are only programmed when the voltage on the column lines is high, so an increase in preprogramming time may be required for this embodiment. Increasing the preprogramming time would prevent the transistors along row line 28B from falling into depletion mode, but depending on the timing this longer preprogramming may not be necessary.

Table 3 illustrates the voltages associated with cell 32 which is accessed by the shorted row line and the shorted column line with the circuit of FIG. 1.

TABLE 3

Voltages Relating to a Transistor Accessed by a Shorted Row Line and a Shorted Column Line with an Embodiment of the Invention

|  | Row Line | Source Line | Column Line |
| --- | --- | --- | --- |
| Read | 6 Volts | 0 Volts | 6 Volts |
| Erase | 6 Volts | 12 Volts | 6 Volts |
| Program | 6 Volts | 0 Volts | 6 Volts |

Table 4 illustrates the voltages associated with the transistors at the intersection of row line 28B and control lines 26A, 26C, and 26D with the circuit of FIG. 1.

TABLE 4

Voltages Relating to a Transistor Accessed by a Shorted Row Line and a Nonshorted Column Line

|  | Row Line | Source Line | Column Line |
| --- | --- | --- | --- |
| Read | 6 Volts | 0 Volts | Sensed |
| Erase | 6 Volts | 12 Volts | Float |
| Program | 6 Volts | 0 Volts | 6 Volts |

Figure 2:
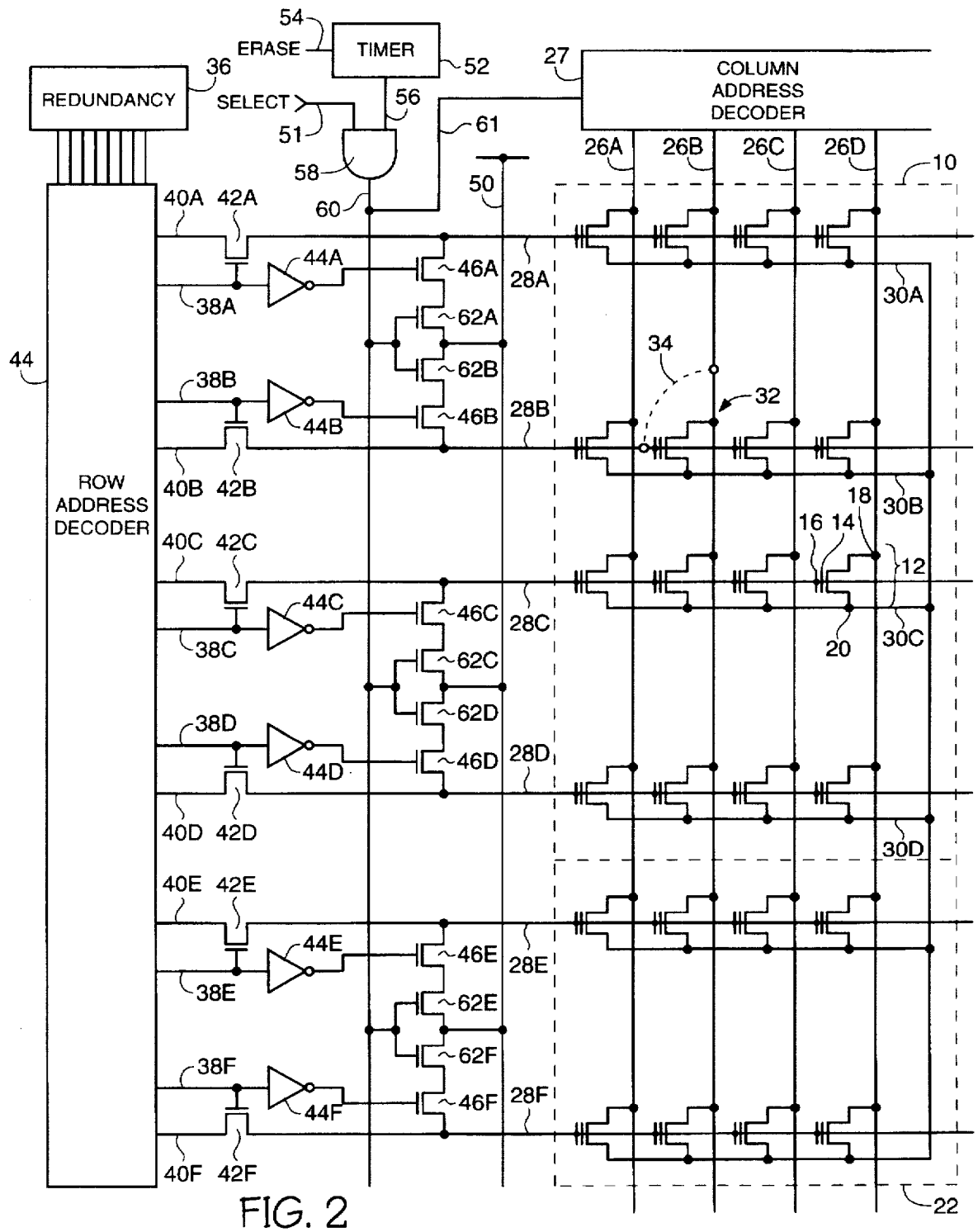
FIG. 2 is a circuit diagram of a second embodiment of the invention.

A second embodiment, which operates similar to the embodiment of FIG. 1, is shown in FIG. 2. FIG. 2 includes a SELECT signal 51 and a timer 52. A SELECT signal is optional, and can be used if it is desirable to disable the circuitry by bringing SELECT low. If SELECT is not used, output 60 can come directly from timer 52 and gate 58 would not be required. It should be understood that SELECT is an option and its use is described below, but one of skill in the art could provide a circuit without SELECT from the description herein.

As described above, when a sector of a flash device is being programmed all the transistors are first programmed and then all are erased to prevent those transistors having a low Vt from being further erased. The cells to be programmed are then programmed individually. Timer 52 receives an ERASE signal 54 from control circuitry (not shown) which conventionally comprises an erase signal. At some time after receiving an ERASE timer 52 outputs at 56 a high which is "ANDed" at 58 with SELECT 51 to output a high at 60 to activate transistors 62A–62F. It can be seen that if the circuitry is to be disabled, SELECT will remain low and transistors 62A–62F will not be activated. With a defective row at 28B and an unused redundant row at 28F, only transistors 46B and 46F of transistors 46A-46F will conduct because they are the only ones having a high control gate. This results from the redundancy elements outputting a low to 38B and 38F and a high to 38A, 38C, 38D, and 38E. Output 60 is further connected through 61 to the column address decoder 27. Element 61 causes all the column lines 26 in the sector to output the column line program voltage (for example six volts). Row lines 40A, 40C, 40D, and 40E, and sector source 30, are held to zero volts. Transistors along row line 28B but not along column line 26B are thereby programmed. Timer 52 outputs a high at 56 for a timed interval, long enough to program transistors along row line 28B (and along 28F). The threshold voltages of the transistors along row lines 40A, 40C, 40D, and 40E do not change substantially during programming of the transistors along 28B and 28F, other than from normal voltage changes. The actual time required to program transistors along row lines 28B and 28F is dependent on the sizing of the transistors as well as other design factors, and can be determined by an artisan in the art from the description herein in conjunction with the flash device design.

In any case, while outputs 60 and 61 are high the column lines go high, row lines 28B and 28F goes high, and the sources and row lines 28A, 28C, 28D, and 28E are low, thereby charging the transistors along row line 28B (and along any other replaced rows or unused redundant rows in the sector) but not the transistors along the remaining row lines. When timer 52 outputs a low, row line 28B floats and column line 26B can function normally. Also, the transistors along 26B except for transistor 32 can function normally. Adding the timer 52 and transistors 62A-62F, therefore, eliminates the need for a redundant column element to replace 26B as may be required for the FIG. 1 embodiment.

Figure 3:
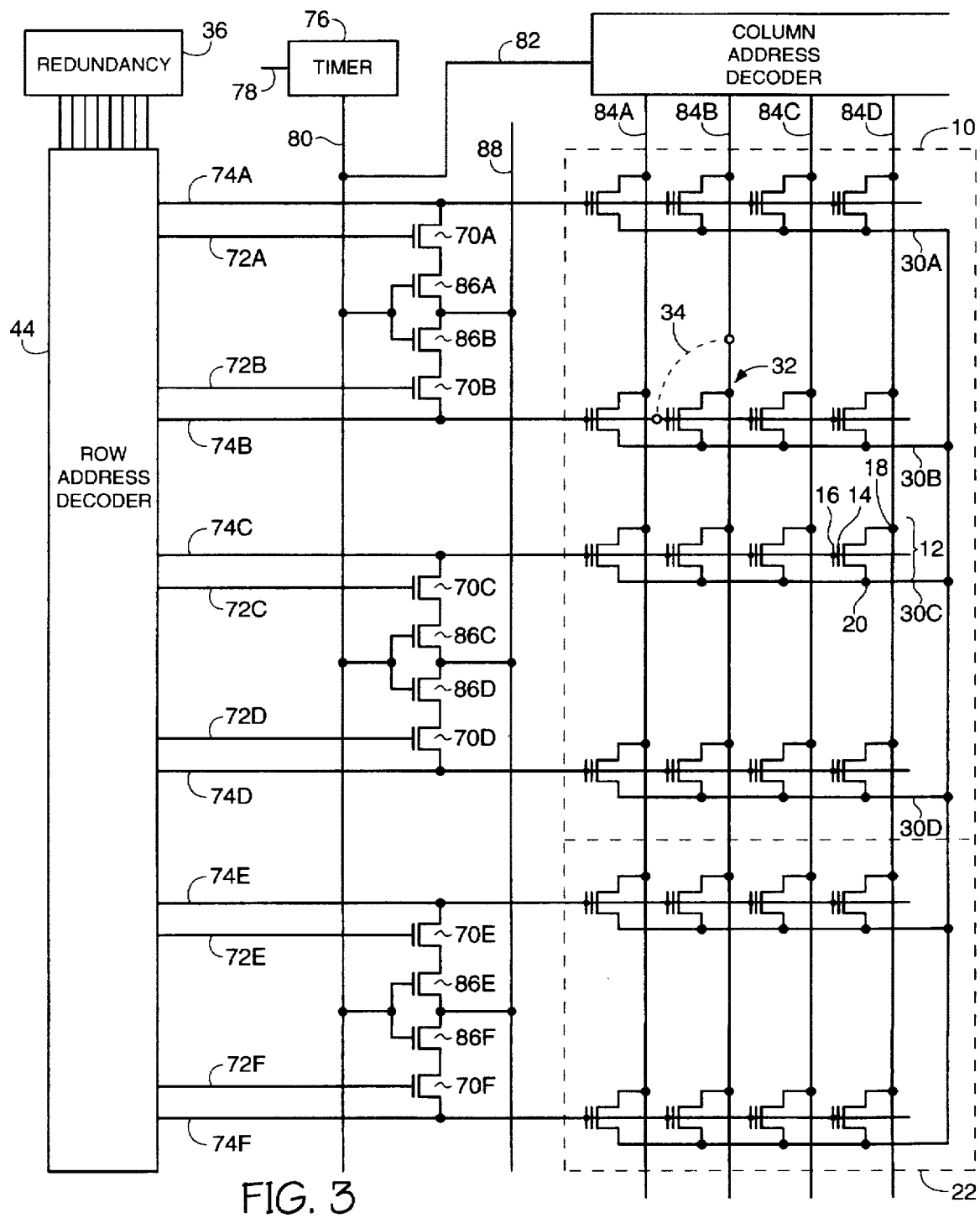
FIG. 3 is a circuit diagram of a third embodiment of the invention.

FIG. 3 shows a third embodiment. In this embodiment, transistors 70A-70F are controlled directly through redundancy signals without the need for inverters. 72A-72F are activated if the corresponding row is being replaced, and deactivated if the corresponding row line is functional. Additionally, row lines 74A-74D are controlled by the row address decoder in a manner according to normally functioning rows. The redundant row lines 74E-74F are similarly controlled by the redundancy circuitry 36 and the address decoder. Timer 76 is controlled by signal 78. Responsive to the activation of timer 76 by signal 78 the timer outputs a signal on 80 and 82 to activate column lines 84A-84D and to activate transistors 86A-86F. Since row line 74B and column line 84B are shorted, signal from 72B activates transistor 70B to electrically connect 88 with 74B. Similarly, row line 74F is an unused redundant row 72F activates transistor 70F to connect 88 with 74F. Row lines 74B and 74F activate thereby programming transistors along row lines 74B and 74F. Row lines 74A, 74C and 74E are held so transistors along row lines 74A, 74C, and 74E are not programmed, and sector source 30 is held to a voltage which allows programming.

The principles of the present invention, which have been disclosed by way of the above examples and discussion, can be implemented using various circuit types and arrangements. For example, the N-type transistors may be changed to P-type transistors, which causes other circuitry to function in a reverse manner. For example, if transistors 46A-46F are P-type, inverters 44A-44F can be eliminated. Also, with changing technology, it is possible and likely that the voltages described will change. Those skilled in the art will readily recognize that these and various other modifications and changes may be made to the present invention without strictly following the exemplary embodiments and applications illustrated and described herein, without departing from the true spirit and scope of the present invention which is set forth in the following claims.

What is claimed is:

1. A method of programming a nonvolatile memory array, said memory array comprising at least primary and redundant conductive lines each having memory elements therealong, said method comprising the steps of:
   preprogramming all said memory elements along said primary and said redundant conductive lines;
   subsequent to said step of preprogramming, erasing all said memory elements along said primary and redundant conductive lines; and
   selecting a unique redundant signal path associated with said redundant conductive line to selectively program said memory elements along said redundant conductive line, wherein said memory elements along said primary conductive line are not read during any read cycle.

2. The method of claim 1 wherein said step of erasing all memory elements includes simultaneously erasing all said memory elements along said primary and redundant conductive lines.

3. The method of claim 1 wherein threshold voltages of said memory elements along said redundant conductive line do not change substantially during said step of programming said all memory elements along said primary conductive line.

4. The method of claim 1 wherein said primary and redundant conductive lines are row lines of an electrically erasable memory device.

5. The method of claim 1 wherein said redundant conductive line functionally replaces said primary conductive line during a read cycle directed to said primary conductive line.

6. A method of programming a nonvolatile memory array, said memory array comprising a plurality of primary row lines including a first primary row line, at least one redundant row line, and a plurality of column lines wherein each said primary row line has memory cells therealong, said method comprising the steps of:
   placing a first voltage on said first primary row line and on said plurality of column lines, and placing a second voltage lower than said first voltage on said plurality of row lines except said first primary row line, thereby programming all said memory cells along said first primary row line;
   subsequent to said step of programming all memory cells along said first primary row line, selectively programming said memory cells along said redundant row line, wherein said memory elements along said first primary row line are not read during any read cycle.

7. The method of claim 6 wherein threshold voltages of said memory cells along said redundant row line do not change substantially during said step of programming all memory cells along said first primary row line.

8. The method of claim 6 wherein said redundant row line functionally replaces said first primary row line.

9. The method of claim 6 wherein said first voltage is applied said first primary row line during any read, program, or erasure of said memory array.

10. The method of claim 6 wherein said cells each comprise a control gate, a source, and a drain, and a threshold voltage of each transistor along said first primary row line ramps during said step of programming all memory cells along said primary row line until said threshold voltage for each cell generally equals a voltage across said gate and said source.

11. The method of claim 6 further comprising a second redundant row line wherein said first voltage is applied to said second redundant row line during said step of programming all memory cells along said primary row line.

12. The method of claim 11 wherein said second redundant row line does not functionally replace a primary row line.

13. The method of claim 6 wherein said first voltage is applied to said first primary row line during said step of selectively programming said memory cells along said redundant row line and a third voltage is applied to said plurality of primary row lines except said first primary row line, said third voltage being higher than said first voltage.

14. The method of claim 1 further comprising the step of deselecting a unique redundant signal path associated with said primary conductive line during said step of selecting a unique redundant signal path associated with said redundant conductive line.

15. The method of claim 14 further comprising the steps of:
applying a first potential to said redundant signal path associated with said redundant conductive line and a second potential to said redundant signal path associated with said primary conductive line;
responsive to said application of said potentials to said redundant signal paths of said conductive lines, coupling said redundant conductive line with a first voltage signal and coupling said primary conductive line with a second voltage signal different from said first voltage signal.

16. The method of claim 15 wherein said step of coupling said conductive lines with said voltage signals includes a unique pass transistor associated with each said redundant signal path.

17. The method of claim 6 wherein said primary and redundant row lines each have a unique redundancy signal path.

18. The method of claim 17 wherein each redundancy signal path includes a unique pass transistor associated therewith.

19. The method of claim 18 wherein each said primary row line includes a unique pass transistor associated therewith.

20. A method of programming a nonvolatile memory device comprising the following steps:
providing a memory address;
applying a first potential to a first redundancy signal path thereby coupling a first row line associated with said first redundancy signal path and with said address to a first voltage signal; and
applying a second potential different from said first potential to a second redundancy signal path thereby coupling a second row line associated with said second redundancy signal path and with said address to a second voltage signal different from said first voltage signal.

21. The method of claim 20 further comprising the following steps:
applying a third potential to a first primary signal path associated with said first row line while applying said first potential to said first redundancy signal path;
applying said third voltage to a second primary signal path associated with said second row line while applying said second potential to said second redundancy signal path.

22. The method of claim 21 wherein said application of said first and second voltages includes a first unique pass transistor associated with said first redundancy signal path and a unique pass transistor associated with said second redundancy signal path.

* * * * *

UNITED STATES PATENT AND TRADEMARK OFFICE
CERTIFICATE OF CORRECTION

PATENT NO. : 5,748,527
DATED : May 5, 1998
INVENTOR(S) : Lee et al

It is certified that error appears in the above-identified patent and that said Letters Patent is hereby corrected as shown below:

Column 3, line 16, after "In", please delete -- is --.

Column 4, line 66, please replace " 'high' " with -- "high" --.

Column 5, line 9, after "from", please delete -- to --.

Column 5, line 23, after "38F", please delete -- is --.

Column 7, line 24, please replace "goes" with -- go --.

Signed and Sealed this

Fifth Day of January, 1999

Attest:

Attesting Officer

*Acting Commissioner of Patents and Trademarks*